(12) United States Patent
Oishi

(10) Patent No.: US 7,629,853 B2
(45) Date of Patent: Dec. 8, 2009

(54) AMPLIFYING APPARATUS AND BIAS STABILIZATION CIRCUIT

(75) Inventor: Kazuaki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/198,164

(22) Filed: Aug. 26, 2008

(65) Prior Publication Data

US 2009/0108939 A1   Apr. 30, 2009

(30) Foreign Application Priority Data

Oct. 25, 2007   (JP)   ............... 2007-277627

(51) Int. Cl.
    *H03F 3/04* (2006.01)
(52) U.S. Cl. .............. 330/311; 330/273; 330/134
(58) Field of Classification Search ........ 330/311, 330/273, 134, 131
    See application file for complete search history.

(56) References Cited

U.S. PATENT DOCUMENTS

| | | | | |
|---|---|---|---|---|
| 4,521,740 A | * | 6/1985 | Nakayama | .......... 330/267 |
| 5,019,789 A | * | 5/1991 | Graeme et al. | .......... 330/273 |
| 6,046,642 A | * | 4/2000 | Brayton et al. | .......... 330/296 |
| 6,236,266 B1 | * | 5/2001 | Choumei et al. | .......... 330/133 |
| 6,583,667 B1 | * | 6/2003 | Dasgupta et al. | .......... 330/254 |
| 6,680,645 B2 | | 1/2004 | Greitschus et al. | |
| 7,023,281 B1 | * | 4/2006 | Ali | .......... 330/311 |

FOREIGN PATENT DOCUMENTS

| | | |
|---|---|---|
| JP | 8-288754 | 11/1996 |
| JP | 9-307369 | 11/1997 |
| JP | 10-41753 | 2/1998 |
| JP | 2002-185288 | 6/2002 |

* cited by examiner

*Primary Examiner*—Patricia Nguyen
(74) *Attorney, Agent, or Firm*—Katten Muchin Rosenman LLP

(57) ABSTRACT

An amplifying apparatus including an amplifier having a first FET, a second FET having a source connected to a drain of the first FET, a load resistance connected to a drain of the second FET, a first bias circuit configured to supply a first bias voltage to a gate of the first FET, and a second bias circuit configured to supply a second bias voltage to a gate of the second FET. The second bias circuit includes a second comparison circuit configured to send a control signal to the gate of the second FET so that a bias voltage of a connection node between the first and second FETs changes in conjunction with an output voltage of the first bias circuit.

20 Claims, 12 Drawing Sheets

FIG.10A

RELATED ART EXAMPLE

| min | typ | max | |
|---|---|---|---|
| 3.3 | 8.1 | 9.9 | dB |
| (−4.8) | | (+1.8) | dB |

FOURTH EMBODIMENT

| min | typ | max | |
|---|---|---|---|
| 5.4 | 8.1 | 9.1 | dB |
| (−2.7) | | (+1.0) | dB |

AMPLIFYING APPARATUS AND BIAS STABILIZATION CIRCUIT

BACKGROUND

1. Field

The present invention relates to an amplifying apparatus and a bias stabilization circuit.

2. Description of the Related Art

FIG. 1 depicts an example of an amplifying apparatus 100. The amplifying apparatus 100 includes an amplifier 101 and a bias Gm compensation circuit 102. The amplifier 101 includes a first FET (Field Effect Transistor) FET1 (104), a second FET FET2 (106), and a load resistance R. The drain of the first FET FET1 (104) is connected to an output terminal OUT of the amplifier 101 via the second FET FET2 (106). The source of the first FET FET1 (104) is connected to a low voltage source. The gate of the first FET FET1 (104) is connected to a signal source S via a capacitor 110. Furthermore, bias is provided to the gate from the bias Gm compensation circuit 102.

The change $\Delta I_{amp}$ of current flowing in the first FET FET1 (104) is proportional to the change of a gate voltage Vin in small signal region. The proportional coefficient is referred to as transconductance and is expressed as:

$$\Delta I_{amp} = Gm \times \Delta Vin$$

Accordingly, the voltage change $\Delta$Vout which is applied to the load resistance is expressed as:

$$\Delta Vout = R \times \Delta I_{amp} = R \times Gm \times \Delta Vin$$

The gain of the amplifying apparatus 100 is defined as R×Gm. The bias Gm compensation circuit 102 applies a suitable bias to the gate of the FET (104) for ensuring that the transconductance of the first FET FET1 (104) is in inverse proportion with respect to the load resistance R. Setting the gain R×Gm to be a constant value reduces the inconsistency of transfer characteristics due to, for example, temperature change in the manufacturing process of the FET or during operation of the FET. This is because a same type of resistance R in an integrated circuit LSI changes in the same manner with respect to, for example, changes in a manufacturing process. For example, Japanese Laid-Open Patent Application No. 2002-185288 (paragraph [0030], FIG. 9) discloses an example of a bias circuit having a FET with a transconductance Gm that is in inverse proportion with respect to the load resistance R.

FIG. 2 depicts a relationship between a drain current and a drain voltage of the first FET FET1 (104) shown in FIG. 1. In a case where a resistance $R_{DS}$ between a source and drain of a FET is relatively large, the drain current hardly changes even if there is a large change in the drain voltage. That is, $\Delta I$ with respect to the $\Delta V$ is considerably small so that it can be ignored. Therefore, even if the drain voltage V1 of the first FET FET1 large changes, the current $I_{amp}$ flowing in each FET is hardly affected. Although the transconductance Gm of the FET changes if the current $I_{amp}$ flowing in the FET changes, the change in the gain is small since the $I_{amp}$ does not easily change.

As the resistance $R_{DS}$ between the source and drain become relatively smaller as the sizes of transistors become finer, change of drain current corresponding to change of drain voltage is becoming an aspect that cannot be ignored. In other words, $\Delta I$ with respect to $\Delta V$ is becoming relatively large. Therefore, the current $I_{amp}$ changes in correspondence with the second FET FET2 (106), and the voltage and current of the drain of the first FET FET1 (104) also easily changes.

When the drain current $I_{amp}$ changes due to changes during a manufacturing process or operating temperature, the gain of the amplifying apparatus 100 also changes. Particularly, in a case where there is an inconsistency in the value of the threshold voltage Vth of the second FET FET2 (106) due to, for example, changes in the manufacturing process, the gain of the amplifier 101 is liable to become significantly inconsistent.

SUMMARY

The present invention may provide an amplifying apparatus and a bias stabilization circuit that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by an amplifying apparatus and a bias stabilization circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the invention provides an amplifying apparatus including an amplifier having a first FET, a second FET having a source connected to a drain of the first FET, a load resistance connected to a drain of the second FET; a first bias circuit configured to supply a first bias voltage to a gate of the first FET; and a second bias circuit configured to supply a second bias voltage to a gate of the second FET; wherein the second bias circuit includes a second bias circuit comparison circuit configured to send a control signal to the gate of the second FET so that a bias voltage of a connection node between the first and second FETs changes in conjunction with an output voltage of the first bias circuit.

Another embodiment of the present invention provides a bias stabilization circuit for supplying a second bias current to a second FET included in an amplifier, the amplifier having a first FET, the second FET, and a load resistance connected in series, the first FET being supplied with a first bias current from a bias Gm compensation circuit, the stabilization circuit including a comparison circuit is configured to send a control signal to a gate of the second FET so that the bias voltage of the connection node between the first and second FETs is equal to an output voltage of the bias Gm compensation circuit.

Other objects and further features of the present invention will be apparent from the following detailed description when read in conjunction with the accompanying drawings.

BRIEF DESCRIPTION OF THE DRAWINGS

FIGS. 10A and 10B are for describing results of simulation performed on the fourth embodiment of the present invention and a related art example.

DESCRIPTION OF THE PREFERRED
EMBODIMENTS

In the following, embodiments of the present invention will be described with reference to the accompanying drawings.

First Embodiment

Figure 3:
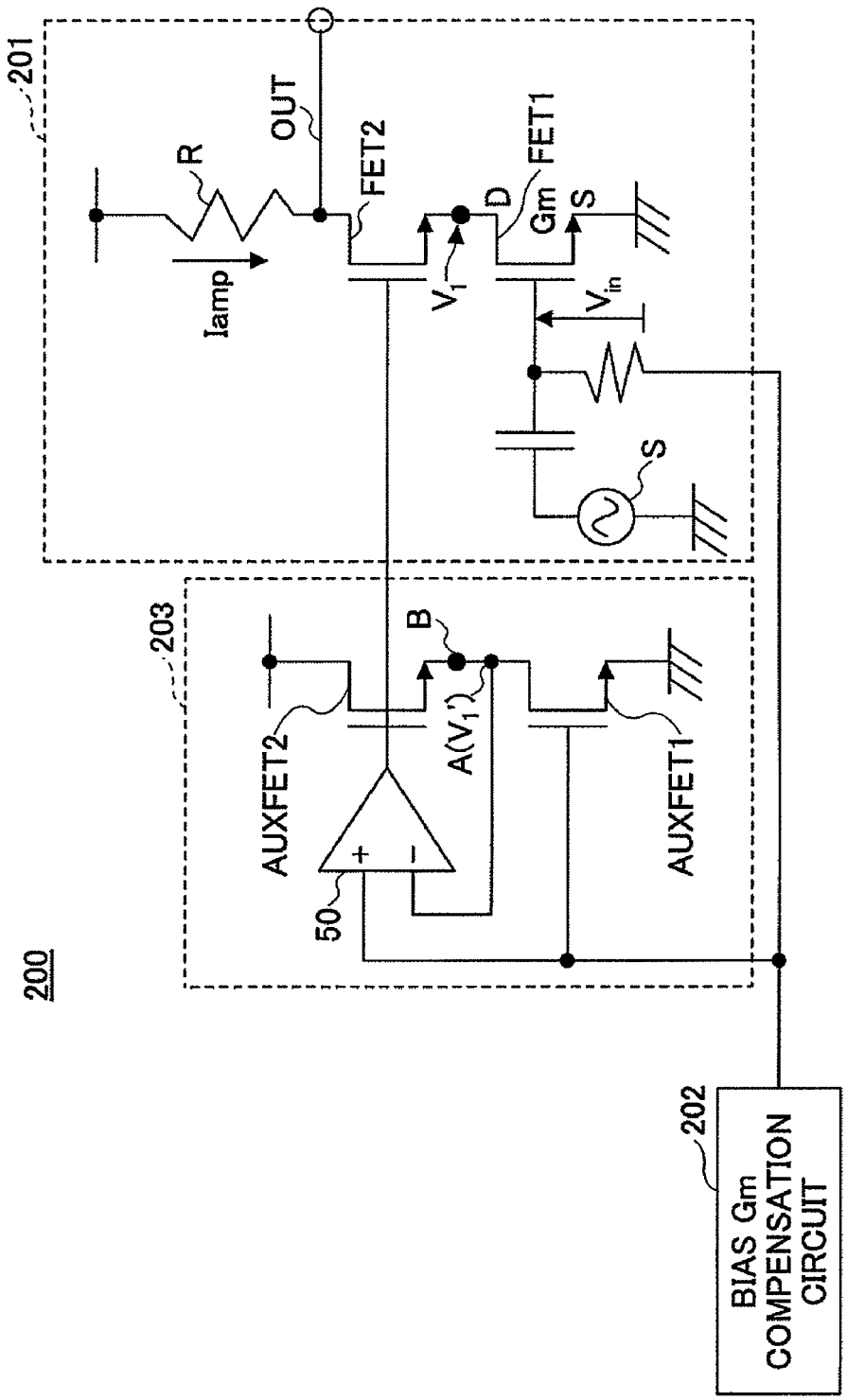
FIG. 3 is a schematic diagram showing an amplifying apparatus according to a first embodiment of the present invention.

FIG. 3 depicts an amplifying apparatus 200 according to a first embodiment of the present invention. The amplifying apparatus 200 includes, for example, an amplifier 201, a bias Gm compensation circuit 202, and a bias stabilization circuit 203.

The amplifier 201 includes, for example, a load resistance R, a first N channel field effect transistor (FET) (hereinafter referred to as "first FET FET1") and a second N channel field effect transistor (FET) (hereinafter referred to as "second FET FET2") that are connected in series between a high voltage source and a low voltage source. The drain of the first FET FET1 is connected to an output terminal of the amplifier 201 via the second FET FET2. The source of the first FET FET1 is connected to a low voltage source. The gate of the first FET FET1 is connected to a signal source S via a capacitor. In the FET (at least the first FET FET1) used in this embodiment of the present invention, the source-drain resistance $R_{DS}$ is small so that the drain current corresponding to the drain voltage changes in a substantially linear manner. The bias Gm compensation circuit applies bias to the gate of the first FET FET1.

In this embodiment of the present invention, the bias stabilization circuit 203 is provided in the amplifying apparatus 200. The bias stabilization circuit 203 includes, for example, a first N channel field effect transistor (FET) (hereinafter referred to as "first auxiliary FET AUXFET1") and a second N channel field effect transistor (FET) (hereinafter referred to as "second auxiliary FET AUXFET2") that are connected in series between a high voltage source and a low voltage source via a connection node A. The bias stabilization circuit 203 also includes a comparison circuit. The comparison circuit has a non-inverting input (+) connected to the output of the bias Gm compensation circuit 202, an inverting input (−) connected to the connection node A, and an output connected to the second FET FET2 (and the second auxiliary FET FET2). The comparison circuit may be configured as any circuit known in the technical field of the art that outputs an output signal depending on which one of the input signals is larger.

The comparison circuit may be configured as, for example, an operational amplifier. The first auxiliary FET AUXFET1 has substantially the same electric characteristic as the first FET FET1 of the amplifier 201. The second auxiliary FET AUXFET2 has substantially the same electric characteristic as the second FET FET2 of the amplifier 201. The comparison circuit compares an output voltage of the bias Gm compensation circuit 202 and the voltage V1' of the connection node A and sends a signal indicative of the comparison to the gate of the second auxiliary FET AUXFET2 and the gate of the second FET FET2.

As described above, the change $\Delta I_{amp}$ of current flowing in the first FET FET1 is proportional to the change of a gate voltage Vin in small signal region. The proportional coefficient is referred to as transconductance and is expressed as:

$$\Delta I_{amp} = Gm \times \Delta Vin$$

Accordingly, the voltage change ΔVout which is applied to the load resistance is expressed as:

$$\Delta Vout = R \times \Delta I_{amp} = R \times Gm \times \Delta Vin$$

The gain of the amplifying apparatus 100 is defined as R×Gm. The bias Gm compensation circuit 102 applies a suitable bias to the gate of the FET for ensuring that the transconductance of the first FET FET1 is in inverse proportion with respect to the load resistance R. Setting the gain R×Gm with a constant value is expected to reduce the inconsistency of transfer characteristics due to, for example, temperature change in the manufacturing process of the FET or during operation of the FET. However, the inconsistency of the drain current and the gain may increase as the source/drain resistance Rds of the FET becomes smaller as transistors are fabricated in finer sizes. In contrast, this embodiment of the present invention stabilizes the bias applied to the gate of the second FET FET2, to thereby stabilize the gain of the amplifier 201.

The first and second auxiliary FETs AUXFET1, AUXFET2 of the bias stabilization circuit 203 substantially have the same electric characteristic as the first and second FETs FET1, FET2, respectively, of the amplifier 201. The voltage V1' of the drain of the first auxiliary FET AUXFET1 (connection node A) is reflected to the drain voltage of the first FET FET1. The comparison circuit compares the output voltage of the bias Gm compensation circuit 202 and the voltage V1' of the connection node A and outputs a signal indicative of the result of the comparison. For example, in a case where the output voltage of the bias Gm compensation circuit 202 is greater than the voltage V1' of the connection node A, the drain voltage V1 of the first FET FET1 is less than its original value. Accordingly, in this case, the comparison increases voltage according to the comparison result and sends a signal corresponding to the increased voltage to the gate of the second auxiliary FET AUXFET2 and the gate of the second FET FET2. The source voltage of the second auxiliary FET AUXFET2 and the second FET FET2 increases according to the received increased gate voltage. As a result, the electric potential of the connection node A increases and the voltages input to the comparison circuit attempt to become equal. Thus, the drain voltage of the first FET FET1 increases.

On the other hand, in a case where the output voltage of the bias GM compensation circuit 202 is less than the voltage V1' of the connection node A, the drain voltage V1 of the first FET FET1 is greater than its original value. Accordingly, in this case, the comparison circuit reduces voltage according to the comparison result and sends a signal corresponding to the reduced voltage to the gate of the second auxiliary FET AUXFET2 and the gate of the second FET FET2. The source voltages of the second auxiliary FET AUXFET2 and the second FET FET2 are reduced (decline) according to the received reduced gate voltage. As a result, the electric potential of the connection node A declines and the voltages input to the comparison circuit attempt to become equal. Thus, the drain voltage of the first FET FET1 also declines. Hence, the electric potential V1' of the connection node A becomes stable and the drain voltage V1 of the first FET FET1 corresponding to the electric potential V1' also becomes stable.

Although the voltage of the connection node A is described as corresponding to the drain voltage of the first FET FET1 according to the above-described embodiment of the present invention, the voltage of the connection node A does not need to be equal to the drain voltage of the first FET FET1. For example, in a case where a voltage adjustment resistance Rx is provided between the connection node A and the second auxiliary FET AUXFET2 (vicinity of "B" in FIG. 3), the voltage of the inverting input (−) is reduced in the amount equivalent to the potential difference with respect to the voltage adjustment resistance Rx. Accordingly, compared to a case where no voltage adjustment resistance Rx is provided, the comparison circuit outputs a higher voltage. A signal indicative of the higher voltage is input to the gate of the second FET FET2. Thereby, the drain voltage of the first FET FET1 can be increased. More typically, the polarity changing point (zero point) of a control signal sent to the second FET FET2 can be changed by adding some offset voltage to the input of the comparison circuit.

Second Embodiment

Since first and second FETs are included in the amplifier shown in FIG. 3, it is preferable to consider stabilization of not only the second FET FET2 but also the first FET FET1 from the aspect of stabilizing the gain of the amplifier 201. The second embodiment of the present invention is configured to stabilize the bias applied from the bias Gm compensation circuit to the first FET. Before describing the bias Gm compensation circuit according to the second embodiment of the present invention, problems of a bias Gm compensation circuit 402 according to a related art example are described.

Figure 4:
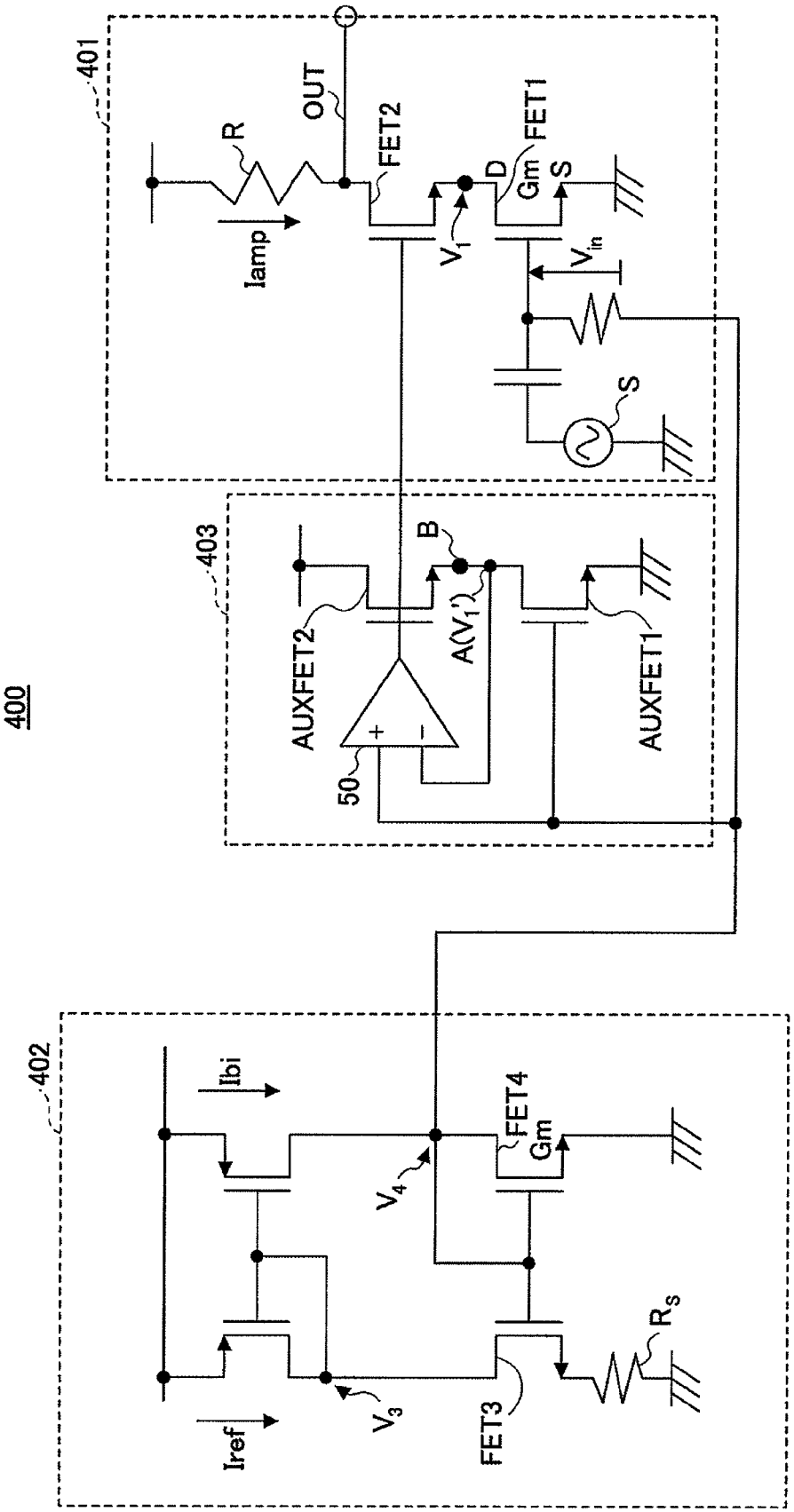
FIG. 4 is a schematic diagram showing a configuration of a bias Gm compensation circuit according to the related art example.

FIG. 4 depicts a configuration of the bias Gm compensation circuit 402 according to the related art example. The bias Gm compensation circuit 402 includes a first P channel FET, a first N channel FET (indicated as "FET3" in FIG. 4), a second P channel FET, and a second N channel FET (indicated as "FET4" in FIG. 4). The first P channel FET includes a source connected to a high voltage source, a gate, and a drain connected to the gate. The first N channel FET FET3 includes a drain connected to the drain of the first P channel FET, a gate, and a source connected to a low voltage source via a resistance Rs. The second P channel FET includes a source connected to the high voltage source, a gate connected to the gate of the first P channel FET, and a drain. The second N channel FET FET4 includes a drain connected to the drain of the second P channel FET, a gate connected to the drain, and a source connected to the low voltage source.

The bias Gm compensation circuit 402 is generally configured as a current mirror circuit. A reference current Iref flowing in the first P channel FET and the first N channel FET FET3 is reflected to the second P channel FET and the second N channel FET FET4. In this case, the transconductance Gm of the second N channel FET FET4 can be approximated by the following formula if the reference current Iref and a bias current Ibi are equal.

$$Gm = \frac{2}{R_S}\left(1 - \frac{1}{\sqrt{K}}\right) \propto \frac{1}{R_S}$$ [Formula 1]

In Formula 1, "Rs" indicates a first resistance Rs connected to the source of the first N channel FET FET3. As shown in Formula 1, the transconductance Gm of the first N channel FET FET3 is in inverse proportion with respect to the first resistance Rs in a case where Iref=Ibi. Therefore, if a current proportional to the bias current Ibi is supplied to an amplifier 401, stabilization of bias can be achieved. As a result, the gain of the amplifier 401 can be stabilized.

Figure 1:
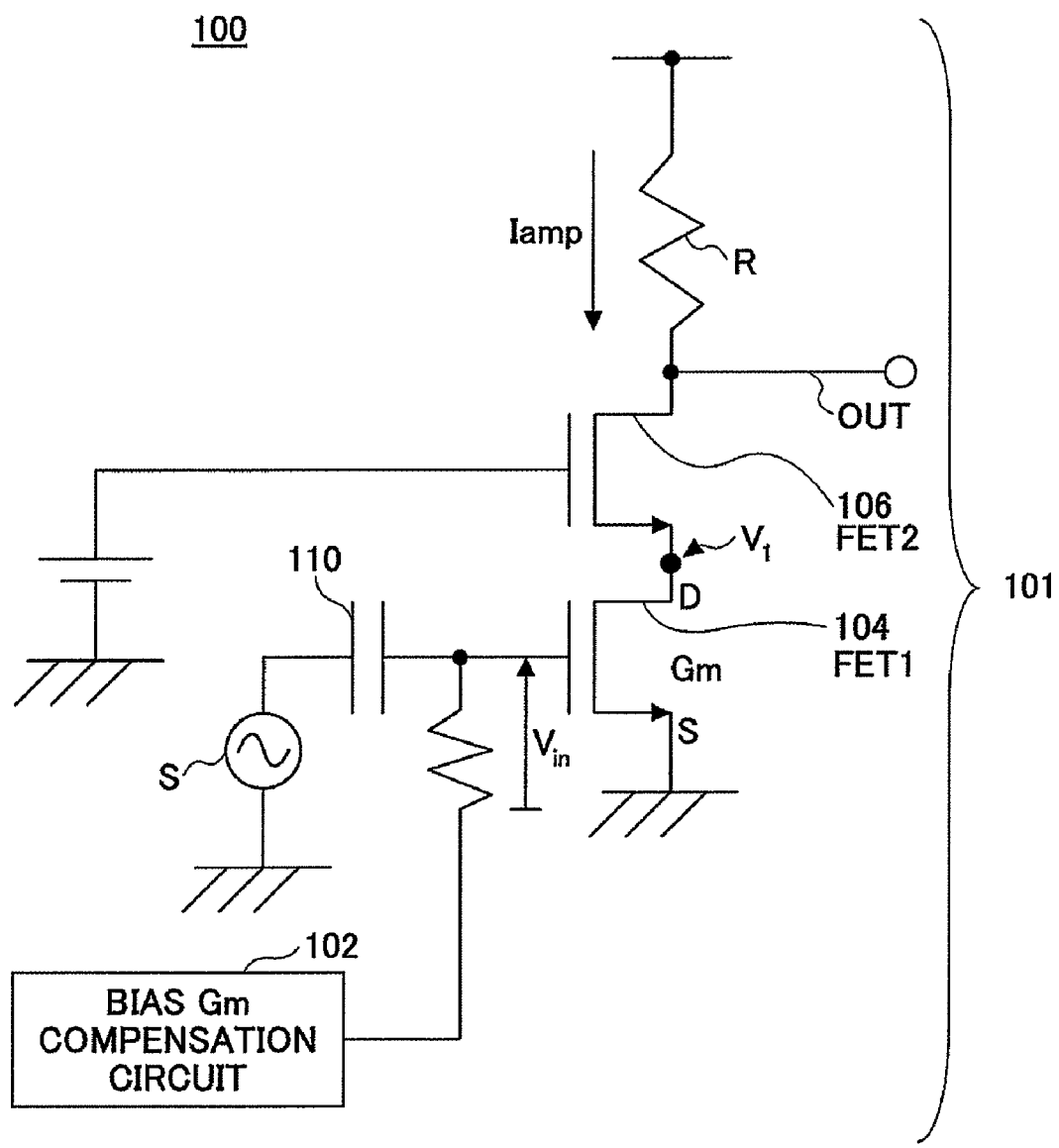
FIG. 1 is a schematic diagram showing an amplifying apparatus according to a related art example.
Figure 2:
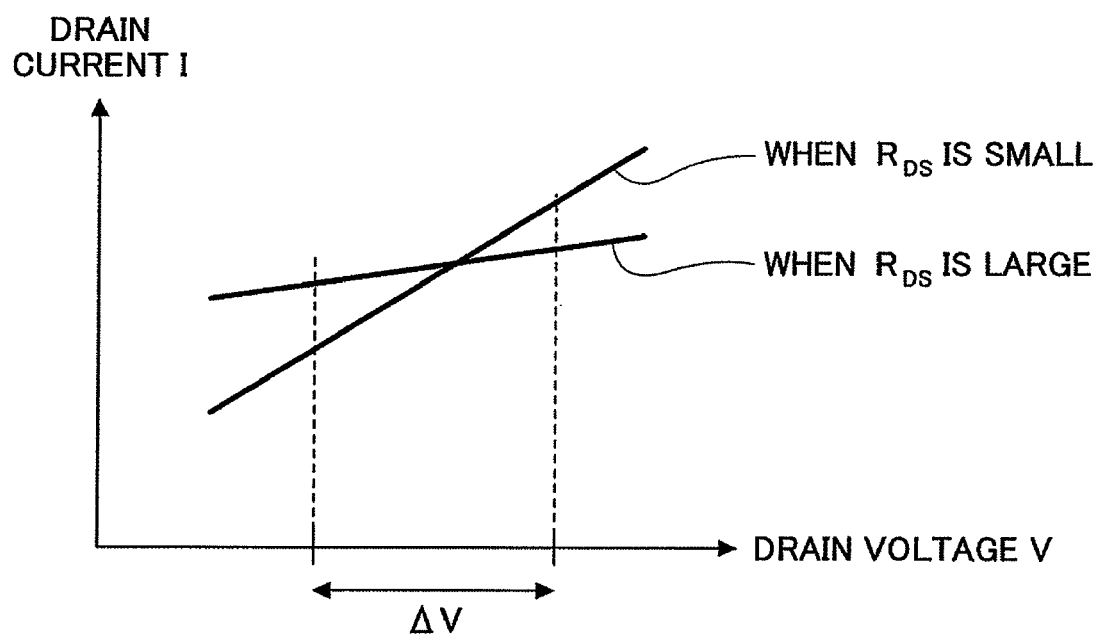
FIG. 2 is a graph for describing characteristics of a drain current and a drain voltage of a FET.

As described above with reference to FIG. 2, there is little change of drain current even if there is a large change of drain voltage in a case where the resistance $R_{DS}$ between the source and the drain of the FET is relatively large. A relationship of Iref=Iout can be maintained even if there is a slight difference in the drain voltages V3, V4 of the first N channel FET FET3 and the first N channel FET FET4. Thereby, the above-described approximation formula Gm ∝ 1Rs is satisfied and an initial operation can be ensured. However, the change of drain current corresponding to the change of the drain voltage is not ignorable as the source/drain resistance Rds becomes smaller as transistors are fabricated in finer sizes. It is, therefore, desired that the drain voltages V3, V4 of the first N channel FET FET3 and the first N channel FET FET4 be equal. However, the drain voltage V3 of the first N channel FET FET3 and the drain voltage V4 of the first N channel FET FET4 may not be equal due to various changes (e.g., changes in the manufacturing process, changes of temperature during operation). In this case, the relationship Iref=Iout cannot be maintained, and the approximation formula Gm ∝ 1/Rs cannot be satisfied. As a result, an initial operation cannot be ensured.

Figure 5:
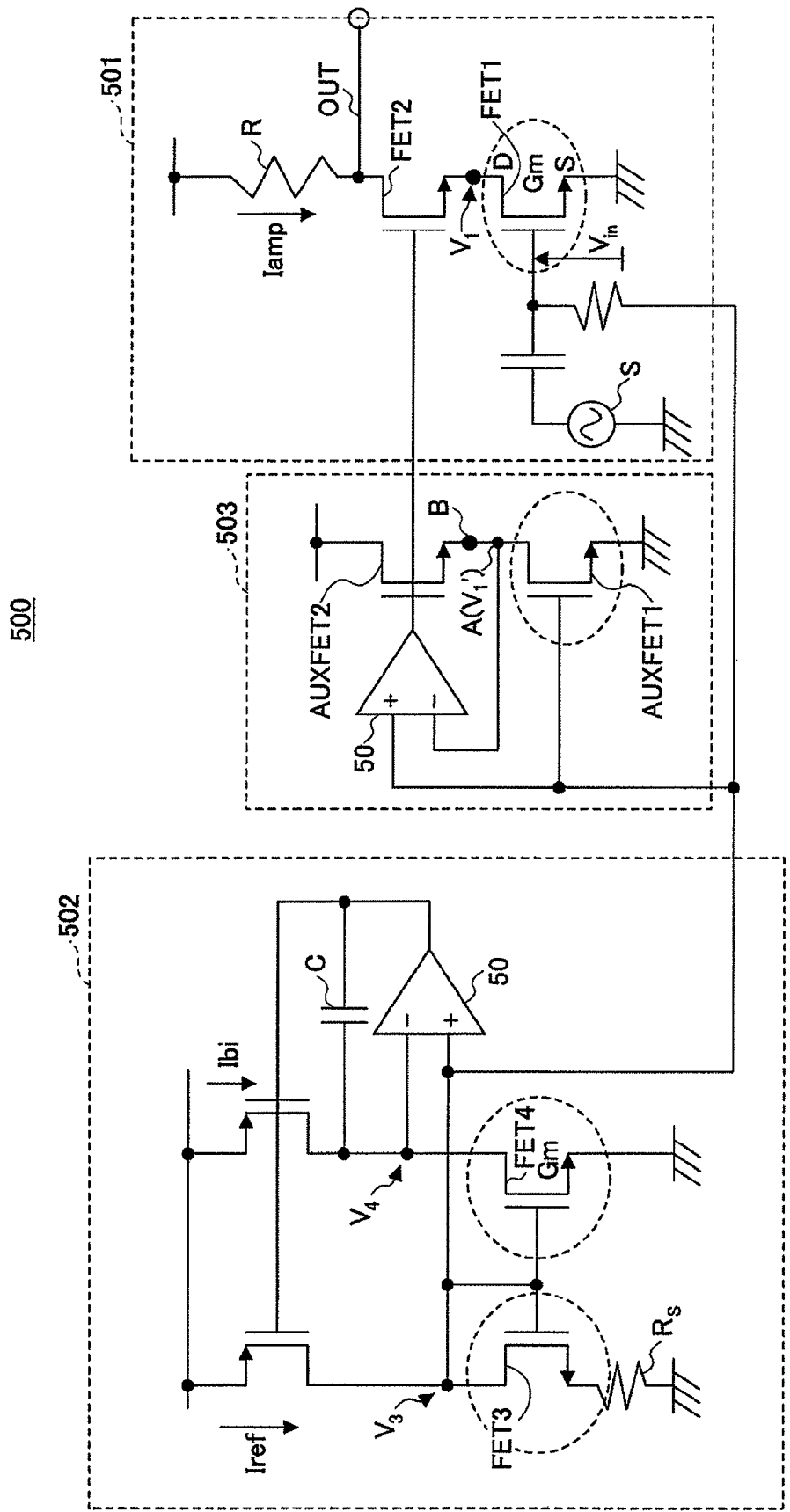
FIG. 5 is a schematic diagram showing a bias Gm compensation circuit according to a second embodiment of the present invention.

FIG. 5 depicts a bias Gm compensation circuit 502 according to the second embodiment of the present invention. In the bias Gm compensation circuit shown in FIG. 5, like components are denoted by like reference numerals and symbols of the configuration shown in FIG. 4 and are not further described.

Unlike the bias Gm compensation circuit 402 shown in FIG. 4, the bias Gm compensation circuit 502 includes a comparision circuit. The comparision circuit includes a non-inverting input (+) connected to the drain of the third FET FET3, an inverting input (−) connected to the drain of the fourth FET FET4, and an output connected to the gates of both the first and second P channel FETs. Furthermore, a phase compensation circuit is provided between the non-inverting input and the output of the operational amplifier. In this embodiment of the present invention, the phase compensation circuit includes a single capacitor C. However, the phase compensation circuit may be configured as a combination of a capacitor, an inductor, and a resistor (e.g., a circuit having a capacitor and a resistor connected in series). The phase compensation circuit may be provided between the inverting input and the output of the comparison circuit. In other words, the phase compensation circuit may be provided in such positions as long as a suitable relative phase between a reference current and a bias current can be attained and oscillation can be prevented from occurring.

Similar to the configuration shown in FIG. 4, the bias Gm compensation circuit 502 shown in FIG. 5 is also configured as a current mirror circuit. A reference current Iref flowing in the third FET FET3 is reflected to the bias current Ibi flowing in the fourth FET FET4. In this case, the transconductance gm of the fourth FET FET4 is proportional to 1/Rs if the reference current Iref and the bias current Ibi are equal. Therefore, if a current proportional to the bias current Ibi is supplied to an amplifier 501, stabilization of bias can be achieved. As a result, the gain of the amplifier 501 can be stabilized.

The bias Gm compensation circuit 502 is controlled so that the drain voltages V3, V4 of the third and fourth FETs are constantly equal. This is further described by using a model replacing the first and second FETs with equivalent circuits as shown in FIG. 6.

Figure 6A:
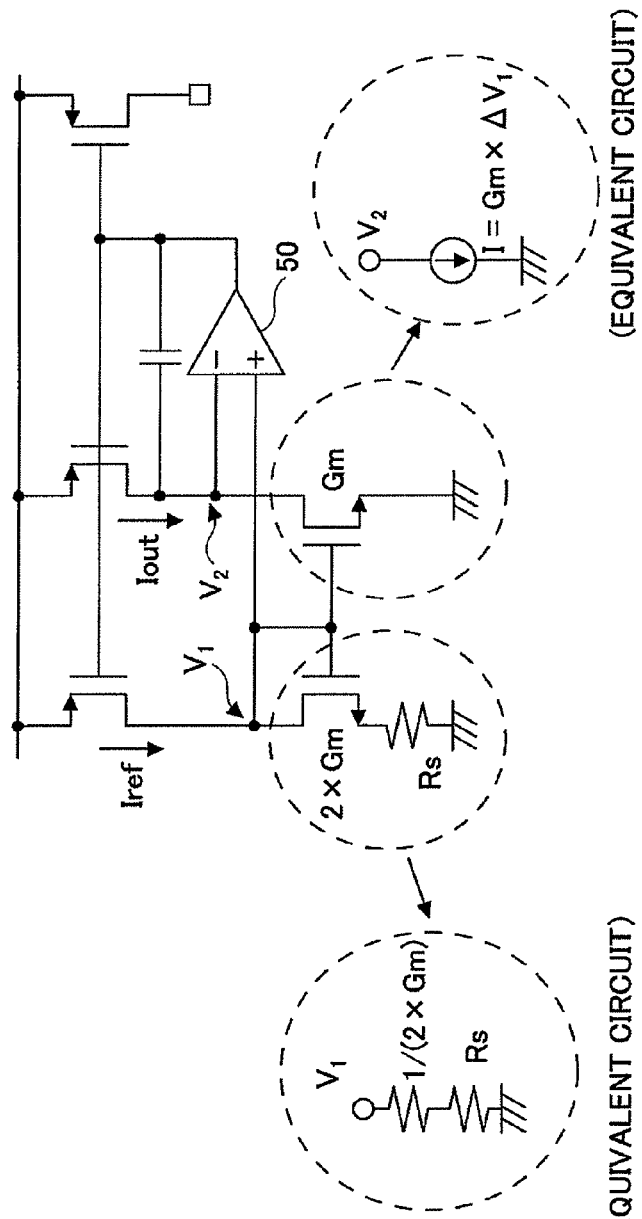
FIGS. 6A and 6B are schematic diagrams for describing operations of a bias Gm compensation circuit.

As depicted in FIG. 6, the third FET FET3 with the gate and drain connected can be regarded as a resistance circuit having a value of 1/(2 Gm). It is, however, assumed that the scale factor K is 4. In this case, the change ΔV3 of drain voltage of the third FET FET3 is expressed as follows:

$$\Delta V3 = (\tfrac{1}{2} Gm) + Rs) \times \Delta Iref$$

Accordingly, the following formula is attained.

[Formula (I)]

$$\Delta Iref = 2\, Gm/(1+2\, Gm \times Rs) \Delta V1 \leq Gm \times V3 \qquad (I)$$

However, in Formula (I), it is assumed that "Gm×Rs>½".

Meanwhile, the fourth FET FET4 is regarded as a current source having a value of Gm×ΔV3. Accordingly, the following formula is attained.

[Formula (II)]

$$\Delta Ibi = Gm \times \Delta V3 \qquad (II)$$

Figure 6B:
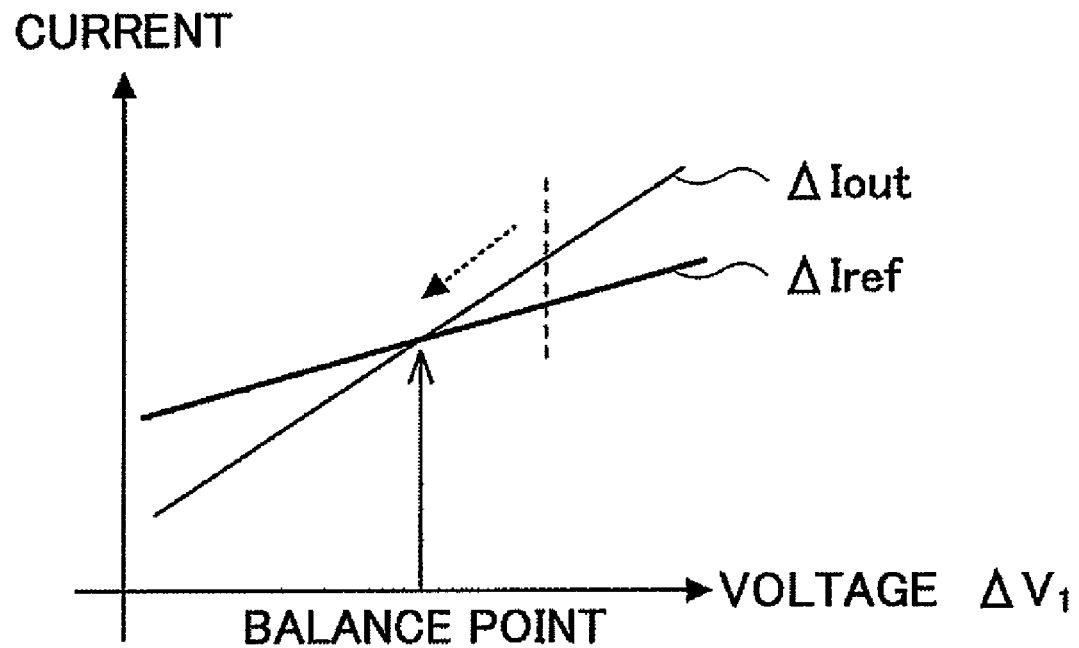

According to the Formulas (I) and (II), the change ΔIref of the reference current is gradual compared to the change Δbi of the bias current from the aspect of current with respect to voltage (See graph of FIG. 6B).

Supposing that Iref<Ibi, V3 becomes greater than V4 (V3>V4) if the resistance Rds between the source and drain each of the first and second P channel FETs is substantially equal. This difference of voltages is input to the comparison circuit 50. In the example shown in FIG. 5, a relatively large voltage is applied to the non-inverting input (+) of the comparison circuit 50 and a relatively small voltage is applied to the inverting input (−) of the comparison circuit 50. The comparison circuit 50 outputs a comparison output signal (high voltage corresponding to the voltage difference in the example shown in FIG. 5), corresponding to the comparison result between the input voltages. The comparison output signal is input to the gate of the first P channel FET and the gate of the second P channel FET. Since the first and second P channel FETs receive high voltages at their gates, currents begin to decline. More specifically, as the reference current Iref and the bias current Ibi begin declining, the drain voltages of the third and fourth FETs FET3, FET4 attempt to become equal. That is, the relationships of V3≠V4 and Iref<Iref change toward satisfying the relationships of V3=V4 and Iref=Ibi.

On the other hand, in a case of Iref>Ibi, V4 becomes greater than V3 (V4>V3) and the difference of the voltages is input to the comparison circuit 50. In the example shown in FIG. 5, a relatively small voltage is applied to the non-inverting input (+) of the comparison circuit 50 and a relatively large voltage is applied to the inverting input (−) of the comparison circuit 50. The comparison circuit 50 outputs a comparison output signal (low voltage corresponding to the voltage difference in the example shown in FIG. 5), corresponding to the comparison result between the input voltages. The comparison output signal is input to the gate of the first P channel FET and the gate of the second P channel FET. Since the first and second P channel FETs receive low voltages at their gates, currents begin to increase. More specifically, as the reference current Iref and the bias current Ibi begin increasing, the drain voltages of the third and fourth FETs FET3, FET4 attempt to become equal. That is, the relationships of V3≠V4 and Iref>Iref change toward satisfying the relationships of V3=V4 and Iref=Ibi.

According to this embodiment of the present invention, the reference current Iref and the bias current Ibi are increased or reduced in accordance with a comparison output signal corresponding to difference of voltages (including polarity) input to the comparison circuit 50 of the bias Gm compensation circuit 502, to thereby satisfy a relationship of Iref=Ibi and perform controls so that a relationship of V3=V4 is satisfied. Furthermore, control is performed together with operation of the bias stabilization circuit 503 so that a relationship of V1=V1′=V3=V4 is satisfied.

In other words, the drain voltages of the first FET FET1, the first auxiliary FET AUXFET1, the third FET FET3, and the fourth FET FET4 are controlled to become equal. As a result, both the first FET FET1 and the second FET FET2 of the amplifier 501 can be stabilized and the gain of the amplifier 501 can be significantly stabilized.

Figure 7:
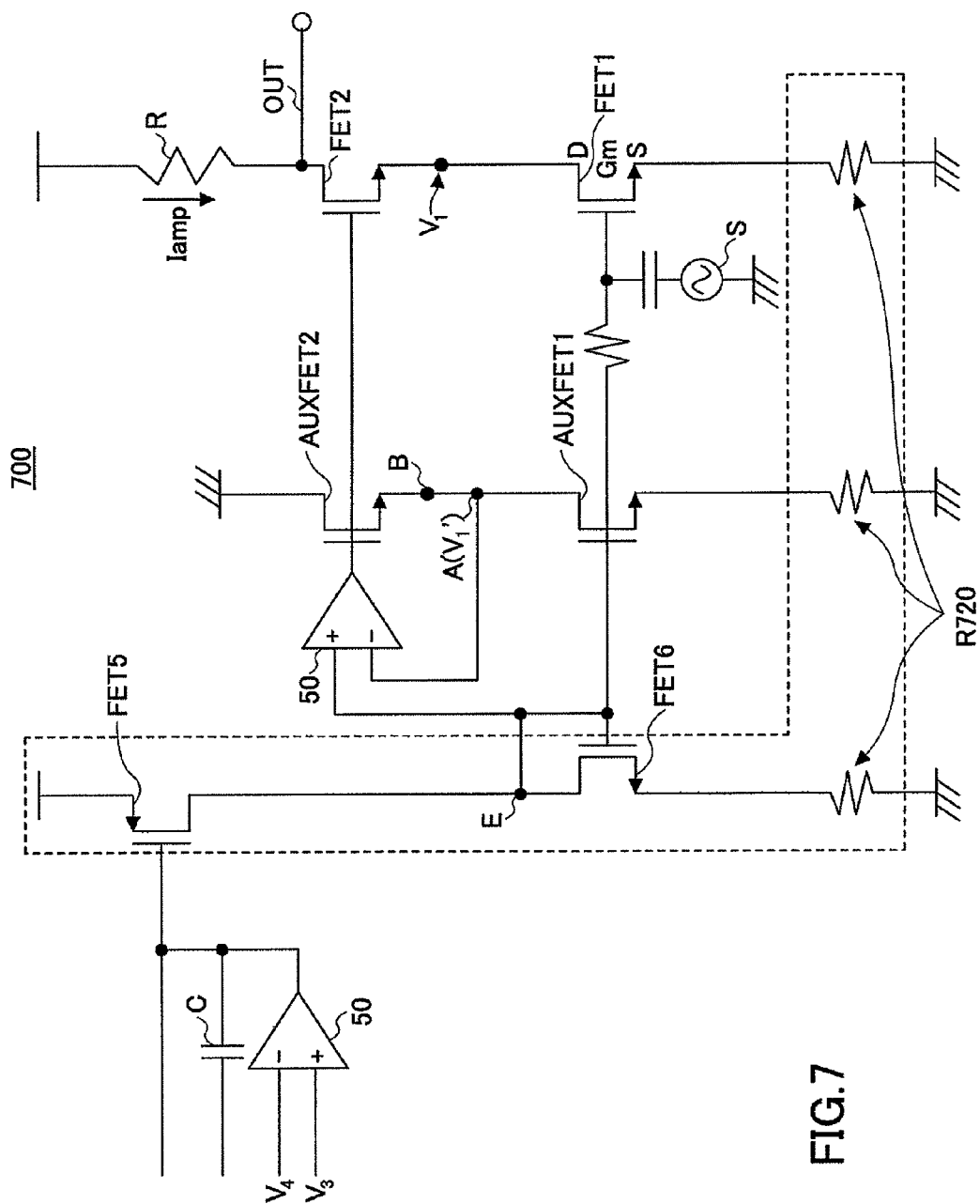
FIG. 7 is a schematic diagram showing an amplifying apparatus according to a modified example of the second embodiment of the present invention.

FIG. 7 depicts another amplifying apparatus 700 according to a modified example of the second embodiment of the present invention. As shown in FIG. 5, the output of the bias Gm compensation circuit 502 may be extracted from the drain of the third FET FET3 (voltage V3) or the drain of the fourth FET FET4 (voltage V4). This is because the drain voltages are controlled to be equal. From the aspect of stability of operation, the output of the bias Gm compensation circuit 502 may be extracted via a current mirror including a fifth FET FET5 and a sixth FET FET6 as shown in FIG. 7. In the example shown in FIG. 7, the fifth FET FET5 includes a gate connected to an output of the comparison circuit 50, a source connected to a high voltage source, and a drain connected to a connection node E. The sixth FET FET6 includes a drain connected to the connection node E, a gate connected to the drain, and a source connected to a low voltage source (e.g., ground (GND)) via a distortion compensation resistor(s) R720. The gate and drain of the sixth FET FET6 are connected to a non-inverting input (+) of the comparison circuit of the bias stabilization circuit 503. Basically, the area surrounded with broken lines in FIG. 7 is the difference between the exemplary configuration shown in FIG. 7 and the configuration shown in FIG. 5. By providing the distortion compensation resistors, the amplifier 501 can be provided with a distortion compensating function. The configuration of having the source or drain connected to a voltage source via the distortion compensation resistor may be applied not only to the second embodiment of the present invention but also to other embodiments of the present invention.

Third Embodiment

Figure 8:
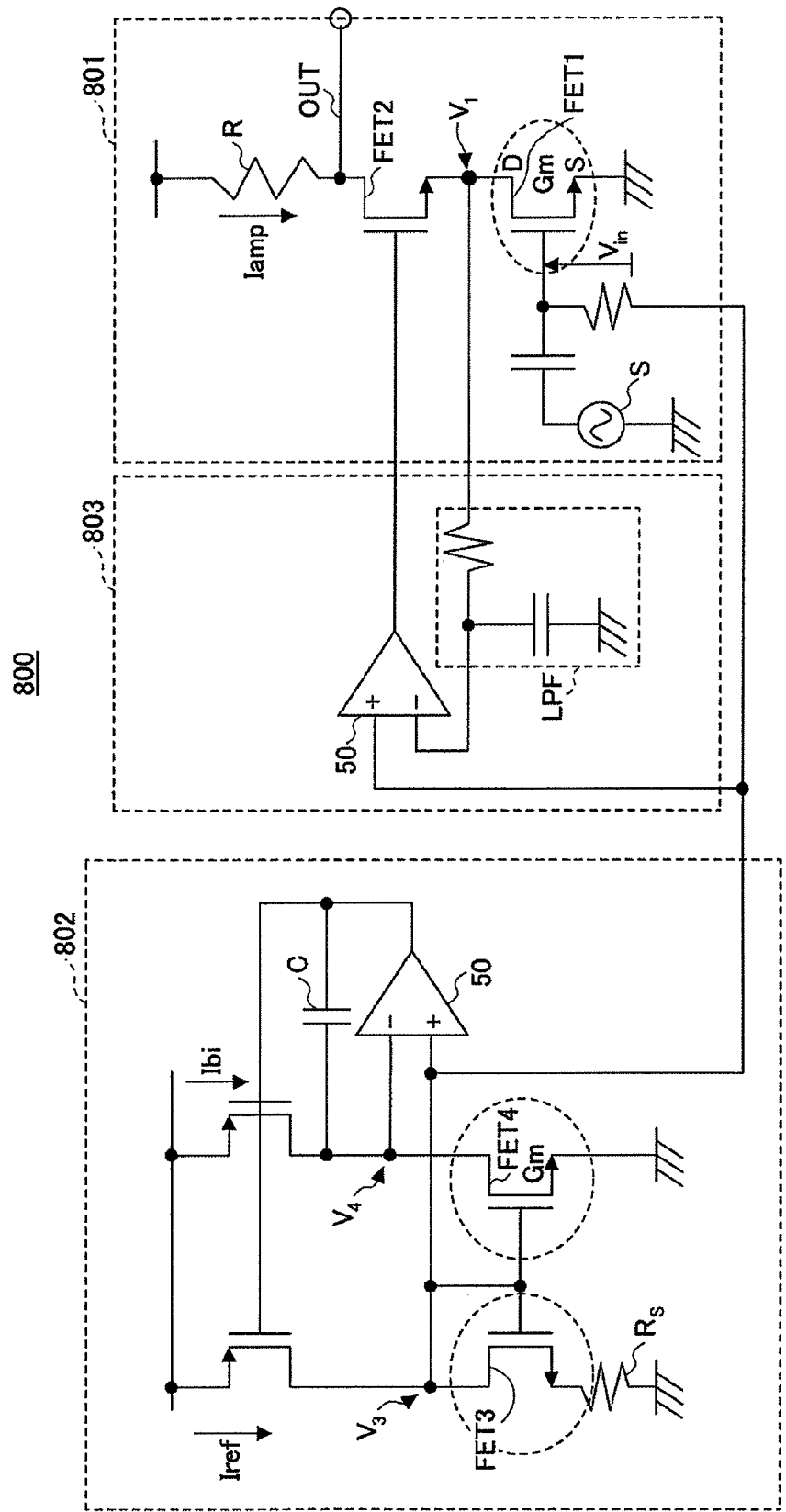
FIG. 8 is a schematic diagram showing an amplifying apparatus according to a third embodiment of the present invention.

FIG. 8 depicts an amplifying apparatus 800 according to a third embodiment of the present invention. The amplifier 801 and the bias Gm compensation circuit 802 basically have the same configuration as those of the above-described embodiments of the present invention and are not described in further detail. The third embodiment of the present invention uses a bias stabilization circuit 803 which is different from that of the second embodiment of the present invention.

The bias stabilization circuit 803 includes a low pass filter LPF and a comparison circuit 50. The low pass filter LPF includes an input connected to a connection node (voltage V1) of the first and second FETs FET1, FET2 of the amplifier 801 and an output connected to an inverting input (−) of the comparison circuit of the bias stabilization circuit 803. The comparison circuit 50 of the bias stabilization circuit 803 includes a non-inverting input (+) connected to the output of the bias Gm compensation circuit 802, the inverting input (−) connected to the output of the low pass filter LPF, and an output connected to the gate of the second FET FET2. The low pass filter LPF removes high frequency components from the voltage of the connection node of the first and second FETs FET1, FET2 of the amplifier 801 and outputs low frequency components of the voltage. In other words, the low pass filter LPF removes small signal components from the voltage V1 of the amplifier 801 and extracts components corresponding to direct voltage. For the purpose of simplification, the low pass filter LPF has a resistor and a capacitor. The resistor has one end connected to the inverting input (−) of the comparison circuit 50 of the bias stabilization circuit 803 and the other end connected to the connection node of the first and second FET FET1, FET2. The capacitor is connected in series with the resistor. It is to be noted that the other known low pass filter circuit configurations may be alternatively used as the low pass filter LPF. The output of the low pass filter LPF and the output of the bias Gm compensation circuit 802 are compared by the comparison circuit 50 and a signal indicative of the comparison is output from the comparison circuit 50.

Supposing that the output voltage of the bias Gm compensation circuit is greater than voltage V1, the drain voltage of the first FET FET1 becomes less than its initial value. In this case, the comparison circuit 50 of the bias stabilization circuit 803 increases voltage according to the result of comparing the input voltages and outputs a signal indicative of the comparison to the gate of the second FET FET2. The second FET FET2 (N channel transistor) attempts to increase the source voltage according to the increase signal received at the gate. As a result, the drain voltage V1 of the first FET FET1 also increases.

On the other hand, supposing that the output voltage of the bias Gm compensation circuit is less than voltage V1, the drain voltage of the first FET FET1 becomes greater than its initial value. In this case, the comparison circuit 50 of the bias stabilization circuit 803 reduces voltage according to the result of comparing the input voltages and outputs a signal indicative of the comparison to the gate of the second FET FET2. The second FET FET2 (N channel transistor) attempts to reduce the source voltage according to the reduction (decline) signal received at the gate. As a result, the drain voltage V1 of the first FET FET1 also declines.

The same as the first and second embodiments of the present invention, the third embodiment of the present invention also performs control so that the drain voltage V1 of the first FET FET1 becomes equal to the output voltage of the bias Gm compensation circuit 802. In the first and second embodiments of the present invention, first and second auxiliary FETs AUXFET1, AUXFET2 serving as duplicates of the first and second FETs FET1, FET2 are provided, and a voltage V3 corresponding to the drain voltage V1 of the first FET FET1 is input to the comparison circuit 50 of the bias stabilization circuit. In the third embodiment of the present invention, the drain voltage V1 of the first FET FET1 is input to the comparison circuit 50 of the bias stabilization circuit 803 via the low pass filter LPF. Since the third embodiment of the present invention does not require the first and second auxiliary FETs AUXFET1, AUXFET2, the third embodiment of the present invention can simplify circuit configuration. Unlike the first and second embodiments of the present invention, the third embodiment of the present invention does not feed back the drain voltage V1 (control target) to the comparison circuit 50. Therefore, unnecessary parasitic elements can be prevented from being formed in the drain of the first FET FET1, to thereby achieve stable operation of the amplifier 801.

Fourth Embodiment

Figure 9:
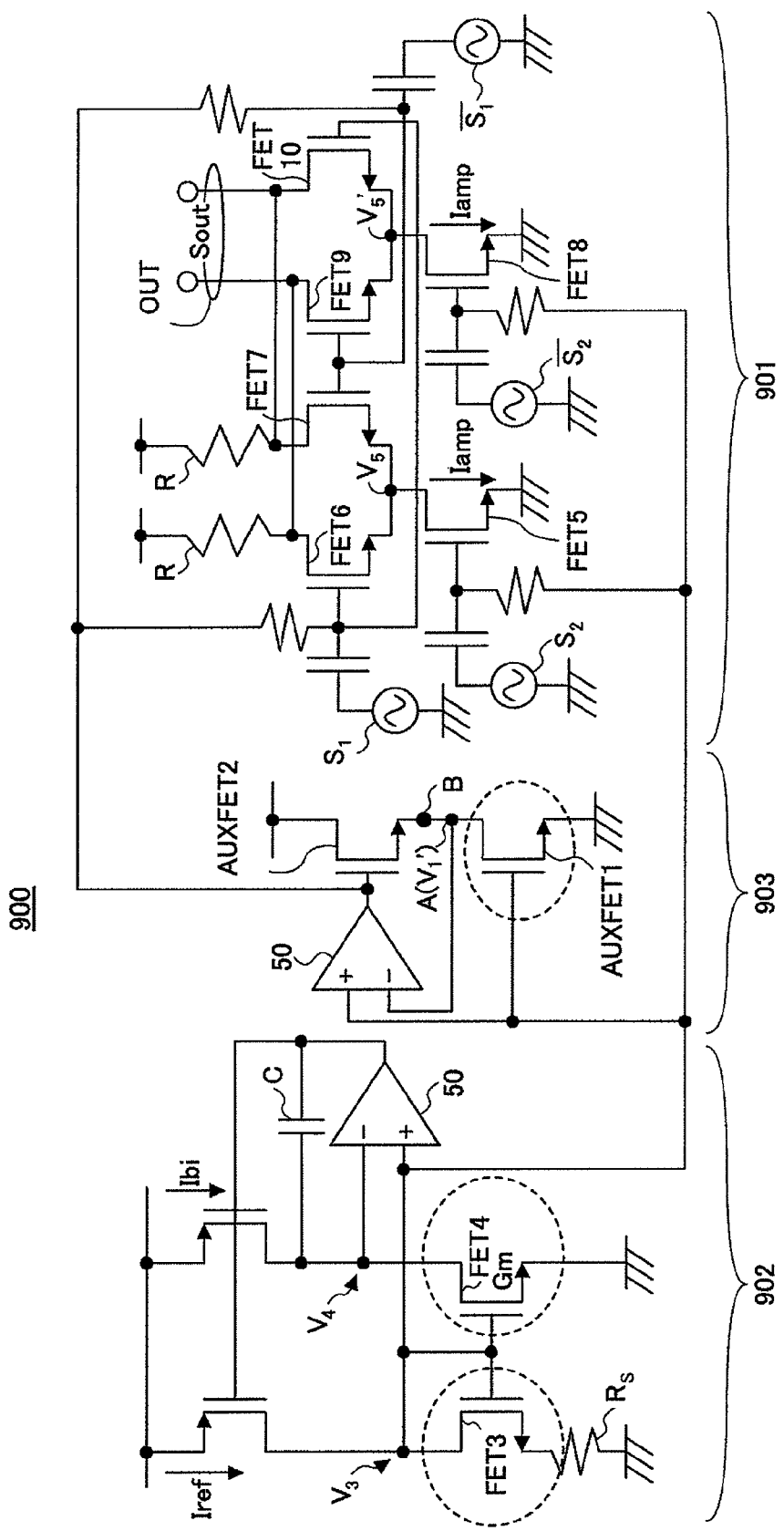
FIG. 9 is a schematic diagram showing an amplifying apparatus according to a fourth embodiment of the present invention.

FIG. 9 is a schematic diagram showing an amplifying apparatus 901 according to a fourth embodiment of the present invention. The amplifying apparatus 901 includes a bias Gs compensation circuit 902, a bias stabilization circuit 903, and a mixer 901 (e.g., gilbert cell mixer). The bias stabilization circuit 903 and the bias Gm compensation circuit 902 basically have the same configuration as those of the above-described embodiments of the present invention and are not described in further detail. In the fourth embodiment of the present invention, the mixer 901 corresponds to the amplifier described in the above-described first-third embodiments of the present invention. The mixer 901 is configured to receive first and second signals S1, S2 and output a signal Sout obtained by multiplying the first and second signals S1 and S2. For example, the mixer 901 is used in a frequency changing part of a wireless communication apparatus in which the first signal S1 may correspond to a local area transmission frequency signal (Lo) and the second signal S2 may correspond to a wireless frequency signal.

The mixer 901 includes two pairs of differential amplifiers arranged in parallel. One differential amplifier includes a pair of transistors having two N channel FETs (referred to as "sixth FET FET6" and "seventh FET FET7"). Corresponding output resistors R are connected between a high voltage source and the drains of the sixth and seventh FETs FET6, FET7. The gates of the sixth and seventh FETs FET6, FET7 receive the first signal S1. The sixth and seventh FETs FET6, FET7 have their sources connected to each other. The voltage of the connection node of the sixth and seventh FETs FET6, FET7 is referred to as "V5" for the sake of convenience. The differential amplifier also includes an N channel FET (referred to as "fifth FET FET5") having a drain connected to the connection node, a gate connected to the output of the bias Gm compensation circuit 903, and a source connected to a low voltage source. The gate of the fifth FET FET5 receives the second signal S2.

The other differential amplifier also includes a pair of transistors and a current source. The pair of transistors has two N channel FETs (referred to as "ninth FET FET9" and "tenth FET FET10"). The drains of the ninth and tenth FETs FET9, FET10 are connected to the drains of a sixth FET FET6 and a seventh FET FET7, to thereby connect to corresponding output resistors R. The gates of the ninth FET FET9 and the tenth FET10 receive the first signals S1. The ninth and tenth FETs FET9, FET10 have their sources connected to each other. The voltage of the connection node of the ninth and tenth FETs FET9, FET10 is referred to as "V5'" for the sake of convenience. The other differential amplifier also includes an N channel FET (referred to as "eighth FET FET8") having a drain connected to the connection node, a gate connected to the output of the bias Gm compensation circuit 903, and a source connected to a low voltage source. The gate of the eighth FET FET8 receives the second signal S2.

The first FET FET1 of the amplifiers of the first-third embodiments of the present invention can be associated with the fifth FET FET5 of this fourth embodiment of the present invention. The second FET FET2 of the amplifiers of the first-third embodiments of the present invention can be associated with the sixth and seventh FETs FET6, FET7 of this fourth embodiment of the present invention. The fourth embodiment of the present invention can stabilize the drain voltage V5 of the fifth FET FET5 and the drain voltage V5' of the eighth FET FET8 in the same manner as stabilizing the drain voltage V1 of the first FET FET1 of the is first-third embodiments of the present invention. More specifically, the fifth FET FET5 and the eighth FET FET8 are associated with the first auxiliary FET AUXFET1. The pair of transistors including the sixth FET FET6 and seventh FET FET7 and the pair of transistors including the ninth FET FET9 and the tenth FET FET10 are associated to the second auxiliary FET AUXFET2. Accordingly, by using the bias stabilization circuit so that the output voltage of the bias Gm compensation circuit becomes equal to the drain voltage V1' of the first auxiliary FET AUXFET, the drain voltage V5 of the fifth FET FET5, the drain voltage V5' of the eighth FET FET8, and the output of the bias Gm compensation circuit become equal (V3=V4=V1'=V5=V5'). Thereby, the mixer serving as the amplifier can have its gain stabilized.

FIG. 10A depicts a comparison result by performing a simulation on the fourth embodiment of the present invention and a related art example. In a case where an amplifying apparatus including the mixer shown in FIG. 9 and an amplifying apparatus including a bias circuit (constant voltage source) of a related art example are manufactured in large numbers, the gain of the amplifying apparatuses are simulated for understanding inconsistency (scattering) of the gains and determining a typical value (TYP), a minimum value (MIN), and a maximum value (MAX). Various changes, for example, change in the manufacturing processes and temperature change during operation are considered in the simulation.

Figure 10B:
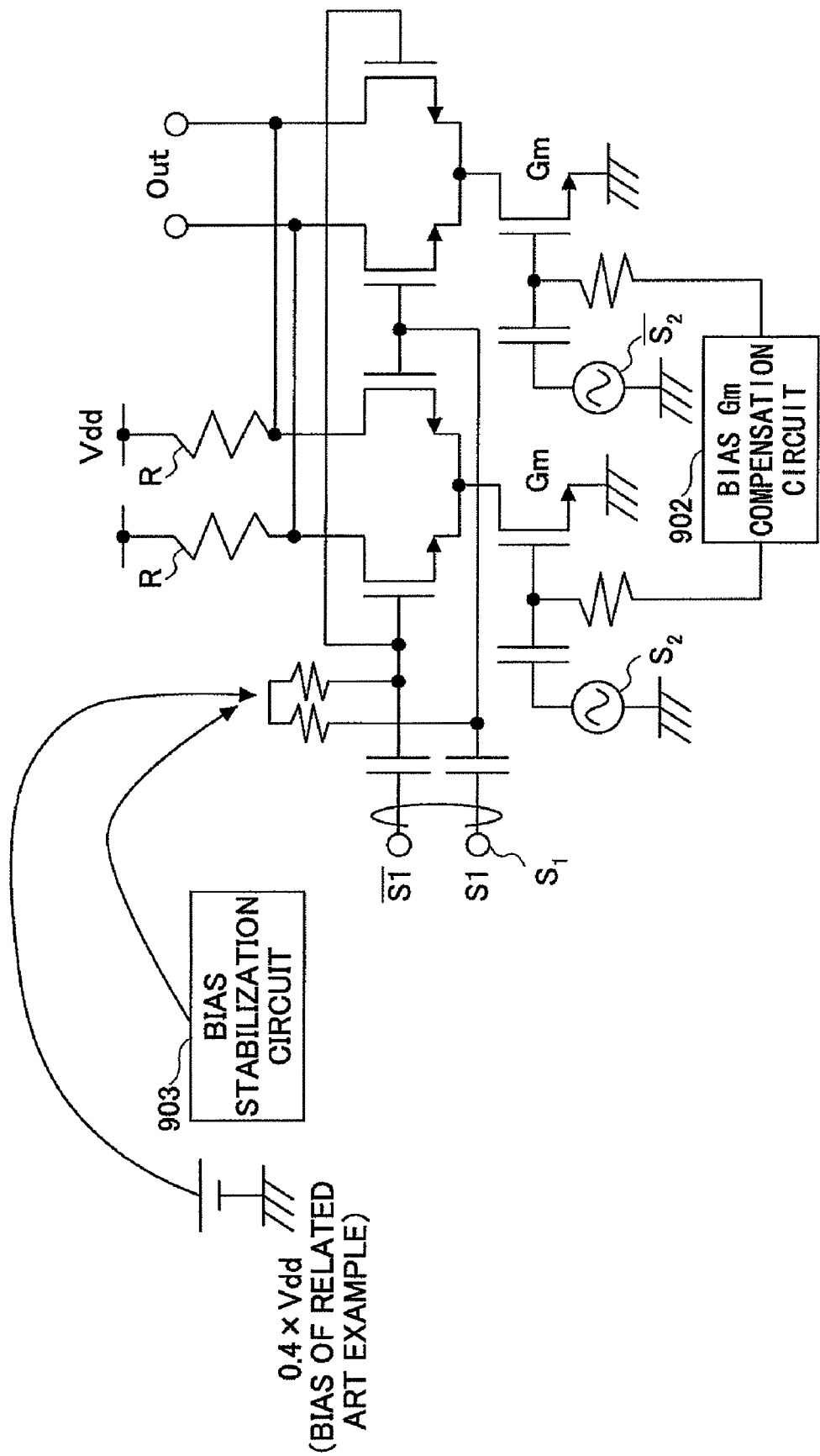

As shown on the left side of FIG. 10A, in a case of the amplifying apparatus using the bias circuit (constant voltage) of the related art example, the gain has a minimum value 3.3 which deviates −4.8 dB (−60%) compared to a typical value of 8.1 and a maximum value 9.9 which deviates +1.8 dB (+22%) compared to the typical value of 8.1. The deviating range of inconsistency (scattering) of the gain with respect the typical value is 82%. On the other hand, as shown on the right side of FIG. 10B, in a case of the amplifying apparatus using the bias circuit according to the fourth embodiment of the present invention, the gain has a minimum value 5.4 which merely deviates −2.7 dB (−33%) compared to a typical value of 8.1 and a maximum value 9.1 which deviates +1.0 dB (+12%) compared to the typical value of 8.1. The deviating range of inconsistency (scattering) of the gain with respect the typical value is 45% (approximately half compared to the related art example). Accordingly, with the fourth embodiment of the present invention, stabilization of gain can be improved compared to the related art example.

With the above described embodiments of the present invention, the bias of serially connected field effect transistors (FETs) of an amplifier can be stabilized, to thereby stabilize the gain of the amplifier.

Further, the present invention is not limited to these embodiments, but variations and modifications may be made without departing from the scope of the present invention. For example, the polarities of the N channel and the P channel may be reversed. Although functions of the parts and components of the apparatus according to the above-described embodiments of the present invention are explained with flowcharts, the apparatus according to the above-described embodiments of the present invention may be achieved by in the form of hardware, software or a combination of software and hardware.

The present application is based on Japanese Priority Application No. 2007-277627 filed on Oct. 25, 2007, with the Japanese Patent Office, the entire contents of which are hereby incorporated herein by reference.

What is claimed is:

1. An amplifying apparatus comprising:
   an amplifier including
   a first FET,
   a second FET having a source connected to a drain of the first FET,
   a load resistance connected to a drain of the second FET;
   a first bias circuit configured to supply a first bias voltage to a gate of the first FET; and
   a second bias circuit configured to supply a second bias voltage to a gate of the second FET;
   wherein the second bias circuit includes a second comparison circuit configured to send a control signal to the gate of the second FET so that a bias voltage of a connection node between the first and second FETs changes in conjunction with an output voltage of the first bias circuit.

2. The amplifying apparatus as claimed in claim 1, wherein the second comparison circuit is configured to send a control signal to the gate of the second FET so that the bias voltage of the connection node between the first and second FETs is equal to an output voltage of the first bias circuit.

3. The amplifying apparatus as claimed in 1, wherein the second bias circuit includes
   a first auxiliary FET having a gate connected to an output of the first bias circuit, and
   a second auxiliary FET having a source connected in series to a drain of the first auxiliary FET via a connection node,
   wherein the second comparison circuit is configured to compare the output voltage of the first bias circuit and a voltage of the connection node and send a signal indicative of the comparison to the gate of the second FET and a gate of the second auxiliary FET.

4. The amplifying apparatus as claimed in claim 1, wherein the second bias circuit includes
   a low pass filter having an input connected to the connection node between the first and second FETs,
   wherein the second comparison circuit is configured to compare the output voltage of the first bias circuit and an output voltage of the low pass filter and send a signal indicative of the comparison to the gate of the second FET.

5. The amplifying apparatus as claimed in claim 1, wherein the first bias circuit includes
   a third FET having first and second electrodes throughwhich a first current flows and including a gate connected to the first electrode,
   a fourth FET having another first and second electrodes throughwhich a second current flows and including a gate connected to the gate of the third FET,
   a first resistor connected to the second electrode of the third FET or the other second electrode of the fourth FET,
   a first comparison circuit sending a signal indicative of a comparison result between a first voltage corresponding to a voltage of the first electrode of the third FET and a second voltage corresponding to a voltage of the other first electrode of the fourth FET,
   wherein the first and second currents are controlled by the signal sent from the first comparison circuit so that the first voltage and the second voltage become equal.

6. The amplifying apparatus as claimed in claim 5, wherein the third and the fourth FETs are N channel FETs, wherein a P channel FET is provided between the first electrode of the third FET and a first high voltage source for acting as a source of the first current, wherein another P channel FET is provided between the first electrode of the fourth FET and a second high voltage source for acting as a source of the second current, wherein the second electrode of the third FET or the other second electrode of the fourth FET is connected to a first low voltage source via a first resistor, wherein the second electrode of the third FET or the other second electrode of the fourth FET that is not connected to the first resistor is connected to a second low voltage source.

7. The amplifying apparatus as claimed in claim 5, wherein the third and the fourth FETs are P channel FETs, wherein a N channel FET is provided between the first electrode of the third FET and a first low voltage source for acting as a source of the first current, wherein another N channel FET is provided between the first electrode of the fourth FET and a second low voltage source for acting as a source of the second current, wherein the second electrode of the third FET or the other second electrode of the fourth FET is connected to a first high voltage source via a first resistor, wherein the second electrode of the third FET or the other second electrode of the fourth FET that is not connected to the first resistor is connected to a second high voltage source.

8. The amplifying apparatus as claimed in claim 1, wherein the first FET is connected to a low voltage source via a resistor.

9. The amplifying apparatus as claimed in claim 2, wherein the first FET is connected to a low voltage source via a resistor.

10. The amplifying apparatus as claimed in claim 4, wherein the first FET is connected to a low voltage source via a resistor.

11. The amplifying apparatus as claimed in claim 3, wherein the first FET and the auxiliary FET are connected to corresponding low voltage sources via a resistor.

12. The amplifying apparatus as claimed in claim 3, wherein the first and second auxiliary FETs are connected in series via a resistor.

13. The amplifying apparatus as claimed in claim 1, wherein the first bias circuit includes
 a third FET having first and second electrodes throughwhich a first current flows and including a gate connected to the first electrode,
 a fourth FET having another first and second electrodes throughwhich a second current flows and including a gate connected to the gate of the third FET,
 a first resistor connected to the second electrode of the third FET or the other second electrode of the fourth FET, and
 a current mirror circuit connected to the first electrode of the third FET and the first electrode of the fourth FET.

14. The amplifying apparatus as claimed in claim 5, wherein the control signal of the second comparison circuit is sent to the gate of the second FET and the control signal of the first comparison circuit is sent to the gate of the first FET.

15. The amplifying apparatus as claimed in claim 3, wherein the source of the first FET and the source of the first auxiliary FET are connected to a low voltage source or a high voltage source via a resistor.

16. The amplifying apparatus as claimed in claim 1, wherein the amplifier is configured as a Gilbert cell mixer having a first terminal for receiving a first signal and a second terminal for receiving a second signal, wherein the amplifier is configured to output a third signal obtained by multiplying the first and second signals.

17. A bias stabilization circuit for supplying a second bias voltage to a second FET included in an amplifier, the amplifier having a first FET, the second FET, and a load resistance connected in series, the first FET being supplied with a first bias current from a bias Gm compensation circuit, the stabilization circuit comprising:
 a comparison circuit is configured to send a control signal to a gate of the second FET so that the bias voltage of the connection node between the first and second FETs is equal to an output voltage of the bias Gm compensation circuit.

18. The bias stabilization circuit as claimed in claim 17, further comprising:
 a first auxiliary FET having a gate connected to an output of the bias Gm compensation circuit, and
 a second auxiliary FET connected in series to the first auxiliary FET via a connection node,
 wherein the comparison circuit is configured to compare the output voltage of the bias Gm compensation circuit and a voltage of the connection node and send a signal indicative of the comparison to the gate of the second FET and a gate of the second auxiliary FET.

19. The bias stabilization circuit as claimed in claim 17, further comprising:
 a low pass filter having an input connected to the connection node between the first and second FETs,
 wherein the comparison circuit is configured to compare the output voltage of the bias Gm compensation circuit and an output voltage of the low pass filter and send a signal indicative of the comparison to the gate of the second FET.

20. The bias stabilization circuit as claimed in claim 18, wherein the first auxiliary FET is connected to a low voltage source via a distortion compensation resistor;
 wherein the first and second auxiliary FETs are connected in series via a distortion compensation resistor.

* * * * *